(12) United States Patent
Ogawa

(10) Patent No.: US 6,339,019 B1
(45) Date of Patent: Jan. 15, 2002

(54) METHOD OF MANUFACTURING SEMICONDUCTOR DEVICE HAVING REDUCED CONNECTION FAILURE BETWEEN WIRING LAYERS

(75) Inventor: Hiroshi Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/245,763

(22) Filed: Feb. 8, 1999

(30) Foreign Application Priority Data

Feb. 12, 1998 (JP) .......................................... 10-029697

(51) Int. Cl.⁷ .................... H01L 21/4763; H01L 21/461
(52) U.S. Cl. ...................... 438/622; 438/636; 438/637; 438/706; 438/710; 438/725; 134/1.2
(58) Field of Search ................................ 438/622–625, 438/636–640, 672, 700, 704, 706, 710, 712, 723, 733, 735, 745, 725; 134/1.2

(56) References Cited

U.S. PATENT DOCUMENTS 5,866,484 A * 2/1999 Muto .......................... 438/738
5,904,154 A * 5/1999 Chien et al. ................. 134/1.2
5,981,374 A * 11/1999 Dalal et al. .................. 438/624

FOREIGN PATENT DOCUMENTS

| JP | 62-24951 | 10/1987 |
| JP | 4-286327 | 10/1992 |
| JP | 4-337633 | 11/1992 |
| JP | 5-102108 | 4/1993 |
| JP | 6-244182 | 9/1994 |
| JP | 8-107144 | 4/1996 |
| JP | 63-245926 | 10/1998 |

\* cited by examiner

*Primary Examiner*—John F. Niebling
*Assistant Examiner*—Ha Tran Nguyen
(74) *Attorney, Agent, or Firm*—Foley & Lardner

(57) ABSTRACT

In a method of manufacturing a semiconductor device, in the first step, a lower interconnection is formed on a semiconductor substrate through a first interlevel insulating film. In the second step, a second interlevel insulating film is formed on the semiconductor substrate including the lower interconnection. In the third step, a through hole is formed in the second interlevel insulating film to reach the lower interconnection. In the fourth step, after the third step is ended, a surface of the lower interconnection including a side surface thereof exposed to a bottom portion of the through hole is etched without exposing the semiconductor substrate to the atmosphere. In the fifth step, a plug made of a conductive material is formed in the through hole. In the sixth step, an upper interconnection to be connected to the plug is formed on the second interlevel insulating film.

4 Claims, 6 Drawing Sheets

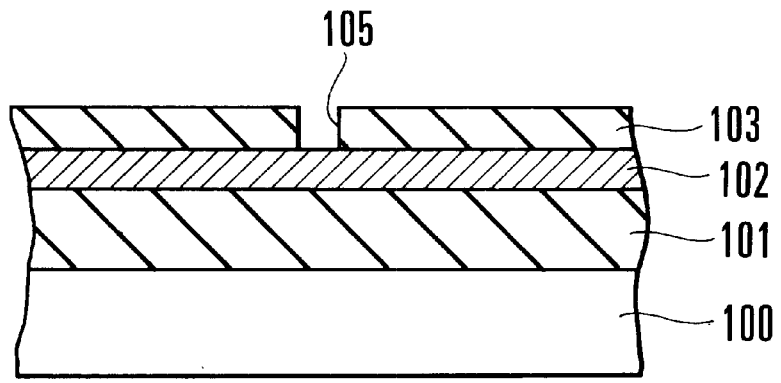
F I G. 1E
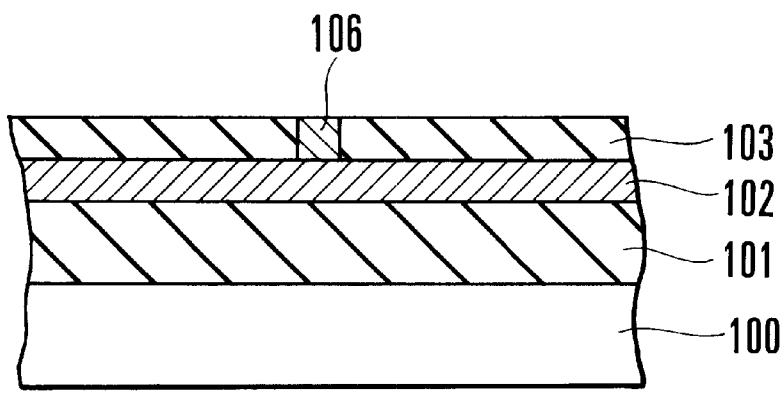
F I G. 1F
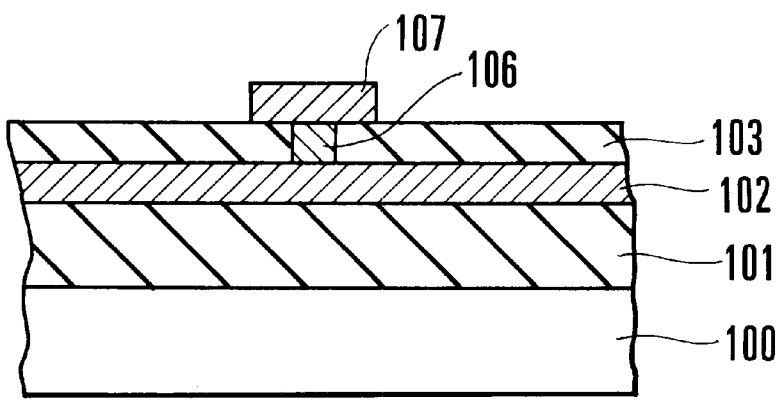
F I G. 1G

METHOD OF MANUFACTURING SEMICONDUCTOR DEVICE HAVING REDUCED CONNECTION FAILURE BETWEEN WIRING LAYERS

BACKGROUND OF THE INVENTION

The present invention relates to a method of manufacturing a semiconductor device having a multilevel interconnection structure.

Due to a higher integration degree, higher density, and higher operation speed of LSIs (Large Scale Integrated circuits) and the versatility of the LSIs, multilevel interconnection formation is an indispensable technique not only in logic devices but also in large-scale memory elements. The multilevel structure decreases the interconnection area substantially to prevent an increase in chip size, and shortens the average interconnection length to suppress delay in operation speed caused by the interconnection resistance.

In this multilevel interconnection technique, it is important to reliably connect wiring layers to each other. Particularly, the connecting technique at many small through hole portions in super LSIs is important. When aluminum is used as the wiring material, an oxide film always exists on the surface of the aluminum film. Hence, when forming a plug to be connected to a lower aluminum interconnection in a through hole, the native oxide on the aluminum interconnection exposed on the bottom surface of the through hole must be removed.

When connecting aluminum multilevel interconnections to each other through a through hole, first, as shown in FIG. 3A, a predetermined element (not shown), a wiring layer (not shown) to be placed on the element, and the like are formed on a semiconductor substrate 300, and an interlevel insulating film 301 is formed to cover the surface of the semiconductor substrate 300. Then, a lower interconnection 302 made of aluminum is formed on the interlevel insulating film 301.

As shown in FIG. 3B, an interlevel insulating film 303 is formed on the interlevel insulating film 301 including the lower interconnection 302, and a resist pattern 304 having an opening is formed on the interlevel insulating film 303 formed on the lower interconnection 302. As shown in FIG. 3C, by using the resist pattern 304 as a mask, the interlevel insulating film 303 is selectively etched by dry etching using a fluorine-based gas in a dry etching unit, thereby forming a through hole 305.

The semiconductor substrate 300 is extracted from the dry etching unit and exposed to a plasma using oxygen gas in an ashing unit to remove the resist pattern 304, as shown in FIG. 3D. Consecutively, the substrate 300 is unloaded from the ashing unit, and the residual resist which was not removed by the ashing process is removed by a chemical solution process of dipping the substrate 300 in an amine-based solvent. Then, the native oxide on the lower interconnection 302 exposed to the bottom surface of the through hole 305 is removed by a cleaning process using an acid.

Tungsten is selectively deposited to form a plug 306 to fill the through hole 305, as shown in FIG. 3E. Then, as shown in FIG. 3F, an upper interconnection 307 to be connected to the plug 306 is formed on the plug 306 and the interlevel insulating film 303 around the plug 306, so that a multilevel interconnection structure in which the lower and upper interconnections 302 and 307 are connected to each other through the plug 306 is formed.

In the conventional method, although the native oxide film on the lower interconnection 302 on the bottom surface of the through hole 305 is removed, the lower and upper interconnections 302 and 307 are not electrically connected at all in some cases. This is because a defect occurs in connection made through the through hole 305, causing a conduction defect between the lower interconnection 302 and plug 306.

SUMMARY OF THE INVENTION

It is an object of the present invention to provide a semiconductor device manufacturing method in which a connection failure between wiring layers is suppressed.

In order to achieve the above object, according to the present invention, there is provided a method of manufacturing a semiconductor device, comprising the first step of forming a lower interconnection on a semiconductor substrate through a first insulating film, the second step of forming a second insulating film on the semiconductor substrate including the lower interconnection, the third step of forming a through hole in the second insulating film to reach the lower interconnection, the fourth step of etching, after the third step is ended, a surface of the lower interconnection including a side surface thereof exposed to a bottom portion of the through hole without exposing the semiconductor substrate to the atmosphere, the fifth step of forming a plug made of a conductive material in the through hole, and the sixth step of forming an upper interconnection to be connected to the plug on the second insulating film.

BRIEF DESCRIPTION OF THE DRAWINGS

FIGS. 1A to 1G are views for explaining a semiconductor device manufacturing method according to the first embodiment of the present invention;

DESCRIPTION OF THE PREFERRED EMBODIMENTS

Figure 1A:
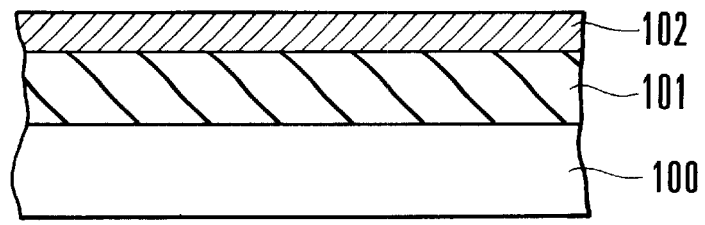

The present invention will be described in detail with reference to the accompanying drawings.

The outline of the present invention will be described first. When connecting wiring layers to each other through a through hole formed in an interlevel film, lower and upper interconnections must be connected to each other through a plug formed in the through hole, as described above.

In the conventional method, a resist pattern used for forming a through hole is ashed by an oxygen gas plasma, and a chemical solution process is performed to remove the ashing residue. The resist cannot be removed completely with the plasma ashing process alone. Therefore, the chemical solution process using, e.g., an amine-based alkali solution that dissolves the resist, is performed.

When the through hole is formed by dry etching using a fluorine-containing gas, an etching reaction product is sometimes deposited on the surface of the lower interconnection (aluminum interconnection) exposed to the bottom portion of the opening of the through hole.

In dry etching that forms a through hole in an insulating film by using a resist pattern made of an organic substance, a fluorine-containing gas plasma is used so that the etching selectivity of the resist pattern and insulating film can be set. In this dry etching, however, the resist pattern is also etched simultaneously, although slightly. Due to etching of the resist pattern, an organic substance is discharged into the plasma. The discharged organic substance and fluorine in the plasma react with each other to generate a deposit comprising an organic substance containing fluorine.

When the fluorine-containing deposit is exposed to the atmosphere while it attaches to the surface of the aluminum interconnection, the deposit and aluminum react with each other because of the moisture present in the atmosphere. Then, the reacted portion of the aluminum interconnection is deteriorated by corrosion, and a new reaction product is formed.

In the conventional method, after dry etching for forming the through hole is performed, ashing is performed to remove the resist. Accordingly, the substrate as the processing target is necessarily exposed to the atmosphere. The etching deposit comes into contact with the atmosphere containing the moisture, and the reaction product described above is formed.

The reaction product formed in this manner cannot be removed at all with the ashing process aiming at resist residual removal described above or the chemical solution process. It has become apparent that, since the reaction product is an insulator, a connection failure occurs as described above.

In the present invention, when performing dry etching to form a through hole, after the through hole forming process using a fluorine-containing gas plasma (first plasma) is performed in the vacuum process vessel of a dry etching unit, the deposit is continuously removed using an inert-gas plasma (second plasma).

This process will be described in more detail.

First Embodiment

First, as shown in FIG. 1A, a predetermined element (not shown), a wiring layer (not shown) to be laid out on the element, and the like are formed on a semiconductor substrate 100, and an interlevel insulating film 101 is formed to cover the surface of the semiconductor substrate 100. Then, a lower interconnection 102 made of aluminum is formed on the interlevel insulating film 101.

Figure 1B:
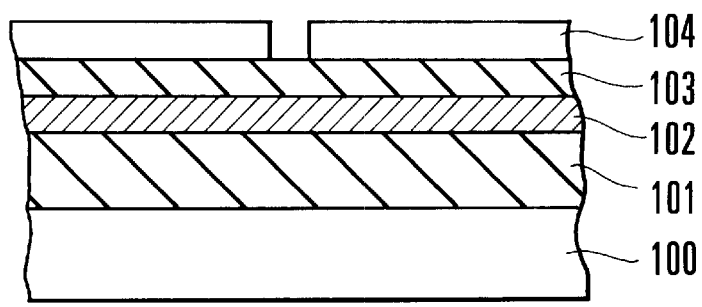

As shown in FIG. 1B, an interlevel insulating film 103 is formed on the interlevel insulating film 101 including the lower interconnection 102, and a resist pattern 104 having an opening is formed on the interlevel insulating film 103 on the lower interconnection 102 by using a known lithography technique.

Figure 1C:
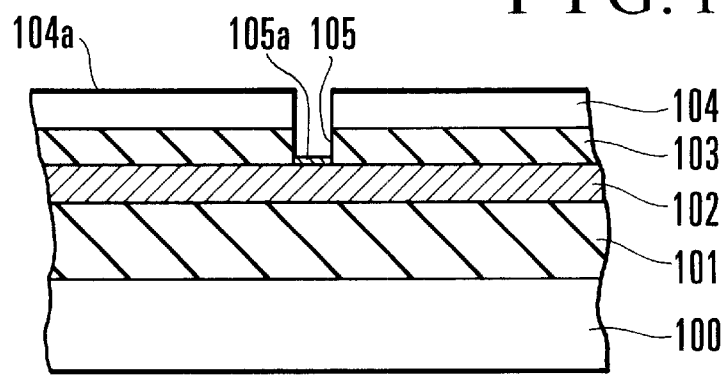

As shown in FIG. 1C, by using the resist pattern 104 as a mask, the interlevel insulating film 103 is selectively etched by dry etching (reactive ion etching) using a fluorine-based gas, thereby forming a through hole 105. More specifically, $CF_4$ gas and $H_2$ gas are introduced into the vacuum process vessel of a dry etching unit, which has been evacuated to a predetermined vacuum degree, to reach a predetermined vacuum degree, and the interlevel insulating film 103 is selectively etched by the plasma of the generated gas (first plasma).

During dry etching for forming the through hole 105, an etching reaction deposit 105a formed by the dry etching reaction is deposited on the lower interconnection 102 exposed to the bottom portion of the through hole 105. Simultaneously, a resist hardening layer 104a is formed on the surface of the resist pattern 104.

The interior of the vacuum process vessel of the dry etching unit used for forming of the through hole 105 is evacuated, and then an inert gas such as argon gas is introduced to perform etching using an argon gas plasma (second plasma). If the argon gas plasma is generated with a lower power than that applied to generate a plasma for selective etching, plasma damage can be more suppressed.

Figure 1D:
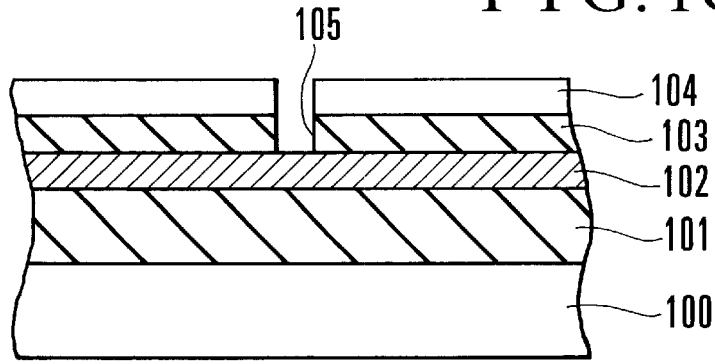

When etching using the argon gas is performed, the resist hardening layer 104a on the resist pattern 104 and the etching reaction deposit 105a on the exposed lower interconnection 102 are removed, as shown in FIG. 1D. In this embodiment, since the substrate 100 is not exposed to the atmosphere in the processes from the dry etching process for forming the through hole to the argon plasma process, the etching reaction deposit 105a does not come into contact with the atmosphere containing moisture. As a result, the etching reaction deposit 105a and the lower interconnection 102 do not react with each other, and no reaction product is formed.

Subsequently, the substrate 100 is unloaded from the dry etching unit, and the resist pattern 104 is removed by the plasma ashing process using an oxygen gas plasma (third plasma), as shown in FIG. 1E. At this time, even when the substrate 100 is unloaded from the dry etching unit and placed in the atmosphere, as the etching reaction deposit 105a has already been removed, no reaction product is formed.

The resist residue is removed by the chemical solution process of dipping the substrate 100 in a chemical solution containing an amine-based alkali solution. The substrate 100 is washed with water and dried, and a plug 106 is formed to fill the through hole 105, as shown in FIG. 1F.

In forming the plug 106, first, the native oxide formed on the surface of the lower interconnection 102 exposed to the bottom portion of the through hole 105 is removed. Then, by sputtering or the like, a tungsten film is deposited on the interlevel insulating film 103 including the interior of the through hole 105, without causing the substrate 100 to come into contact with the atmosphere. Immediately before forming the tungsten film by sputtering, inverse sputtering is performed with this sputtering unit, so that the native oxide on the surface of the lower interconnection 102 exposed to the bottom portion of the through hole 105 can be removed.

The tungsten film on the interlevel insulating film 103 is removed by chemical mechanical polishing so that tungsten is left only in the through hole 105, thereby forming the plug 106.

As shown in FIG. 1G, an upper interconnection 107 to be connected to the plug 106 is formed on the plug 106 and the interlevel insulating film 103 around the plug 106. As a result, a multilevel interconnection structure free from a connection failure between the lower and upper interconnections 102 and 107 is formed.

Second Embodiment

A case wherein a conductive anti-reflecting film is formed on a metal wiring layer, e.g., an aluminum layer, will be described. As the micropatterning degree increases, when forming a fine interconnection pattern by photolithography, an anti-reflecting coating is used to suppress light reflection by an underlayer.

Figure 2A:
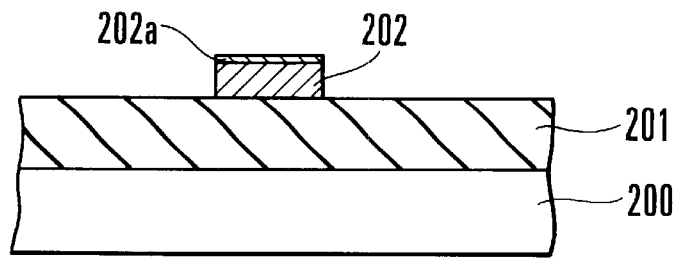
FIGS. 2A to 2G are views for explaining a semiconductor device manufacturing method according to the second embodiment of the present invention.

First, as shown in FIG. 2A, a predetermined element (not shown), a wiring layer (not shown) to be placed on the element, and the like are formed on a substrate 200, and an interlevel insulating film 201 is formed to cover the surface of the substrate 200. Then, a lower interconnection 202 made of aluminum is selectively formed on the interlevel insulating film 201, and a conductive anti-reflecting coating 202a is formed on the lower interconnection 202. FIG. 2A shows the section of the lower interconnection 202 in the direction of width.

Figure 2B:
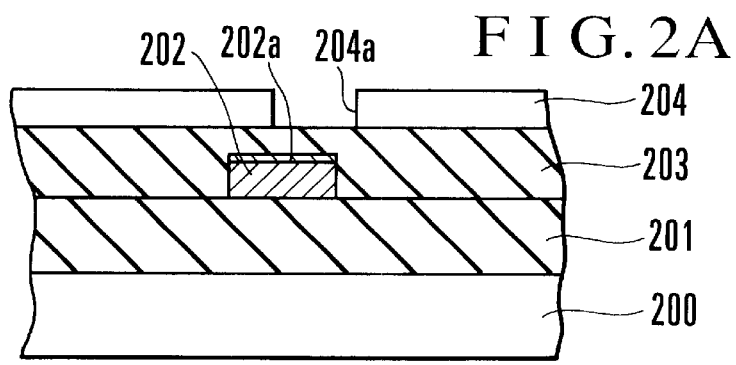

As shown in FIG. 2B, an interlevel insulating film 203 is formed on the interlevel insulating film 201 including the anti-reflecting coating 202a, and a resist pattern 204 having an opening 204a is formed on the film 203 on the lower interconnection 202 by a known lithography technique.

Figure 2C:
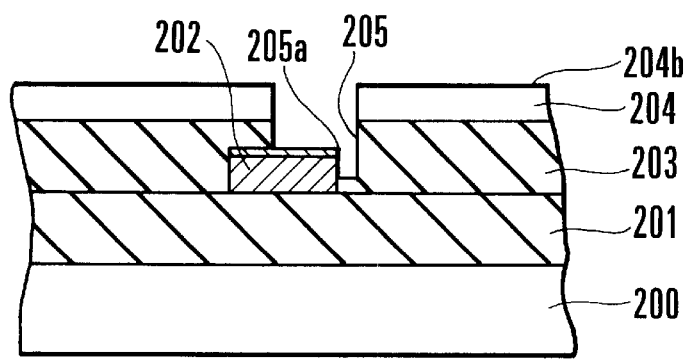

As shown in FIG. 2C, by using the resist pattern 204 as a mask, the interlevel insulating film 203 is selectively etched by dry etching (reactive ion etching) using a fluorine-based gas, thereby forming a through hole 205 at a predetermined position of the lower interconnection 202. For example, $CF_4$ gas and $H_2$ gas are introduced into the vacuum process vessel of a dry etching unit, which has been evacuated to a predetermined vacuum degree, to reach a predetermined vacuum degree, thus generating the plasma of these gases. The interlevel insulating film 203 is selectively etched by this plasma.

In a finer micropatterned interconnection structure, its interconnection width is about, e.g., 0.5 μm. When forming the through hole 205 to be connected to such a thin interconnection, since its hole diameter cannot be decreased very much, it becomes almost equal to the interconnection width. Hence, even when the position of the opening 204a for forming the through hole 205 shifts by as small as 0.2 μm, the position to form the opening 204a shifts from a position immediately above the lower interconnection 202, as shown in FIG. 2B.

In this shifted state, when the interlevel insulating film 203 is selectively etched by using the resist pattern 204 as a mask to form the through hole 205, a side portion of the lower interconnection 202 is exposed, as shown in FIG. 2C.

In this state, when dry etching (reactive ion etching) using a fluorine-based gas is performed, an etching reaction deposit 205a is deposited on the exposed side portion of the lower interconnection 202. Simultaneously, a resist hardening layer 204b is formed on the surface of the resist pattern 204.

In contrast to this, if the resist pattern 204 is formed such that its opening 204a is located immediately above the lower interconnection 202, only the anti-reflecting coating 202a is exposed to the bottom portion of the through hole 205. In this case, the anti-reflecting coating 202a and the etching reaction deposit deposited on it do not form a reaction product that causes a connection failure when they come into contact with the atmosphere containing moisture.

As micropatterning progresses, however, it is difficult to eliminate the positional shift at all. For this reason, as shown in FIG. 2C, sometimes the side portion of the lower interconnection 202 is exposed due to formation of the through hole 205, thus forming the etching reaction deposit 205a. When the lower interconnection 202 and etching reaction deposit 205a come into contact with the atmosphere containing moisture, a reaction product that causes the connection failure is formed.

In the second embodiment as well, in order to solve this problem, the interior of the vacuum process vessel of the dry etching unit that has formed the through hole is evacuated, and then an inert gas such as argon gas is introduced to perform etching using an argon gas plasma, in the same manner as in the first embodiment.

Figure 2D:
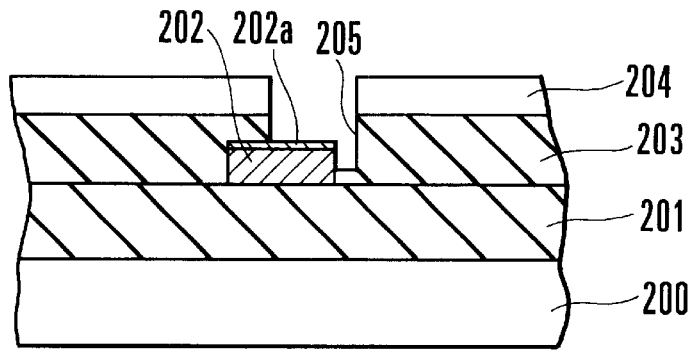

By this etching using the argon gas, the resist hardening layer 204b on the resist pattern 204 and the etching reaction deposit 205a on the side portion of the lower interconnection 202 are removed, as shown in FIG. 2D. Since the substrate 200 is not exposed to the atmosphere in the processes from the dry etching process for forming the through hole to the argon plasma process, the etching reaction deposit 205a does not come into contact with the atmosphere containing moisture. As a result, corrosive deterioration of the lower interconnection 202 by the reaction product of the etching reaction deposit 205a and lower interconnection 202 is prevented, and the problem of connection failure is solved.

Figure 2E:
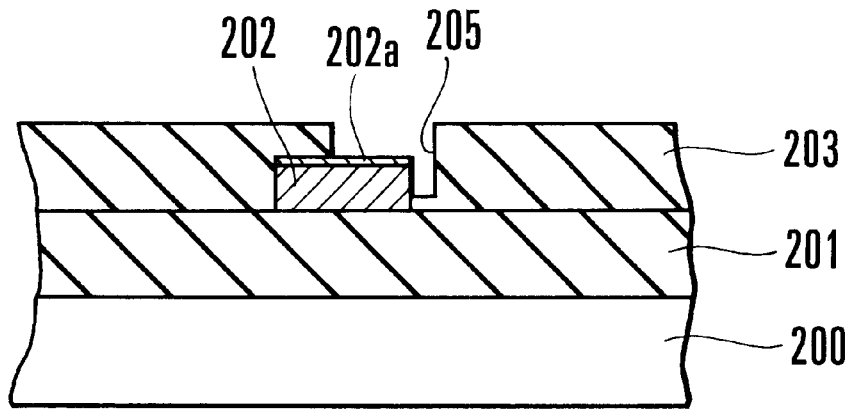

Subsequently, the substrate 200 is unloaded from the dry etching unit, and the resist pattern 204 is removed by the plasma ashing process using an oxygen gas plasma, as shown in FIG. 2E. In this embodiment, when the substrate 200 is unloaded from the dry etching unit, as the etching reaction deposit 205a has already been removed, no reaction product causing a connection failure is formed.

Figure 2F:
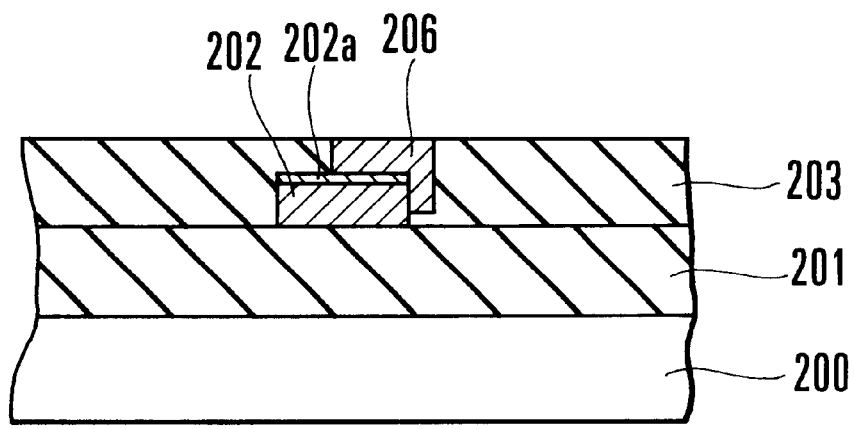

The resist residue is removed by the chemical solution process of dipping the substrate 200 in a chemical solution containing an amine-based alkali solution. The substrate 200 is washed with water and dried, and a plug 206 is formed to fill the through hole 205, as shown in FIG. 2F.

In forming the plug 206, in the same manner as in the first embodiment described above, first, the native oxide formed on the surface of the lower interconnection 202 exposed to the bottom portion of the through hole 205 is removed. Then, by sputtering or the like, a tungsten film is deposited on the interlevel insulating film 203 including the interior of the through hole 205, without bringing the substrate 200 to come into contact with the atmosphere. The tungsten film on the interlevel insulating film 203 is removed by chemical mechanical polishing to leave tungsten only in the through hole 205, thereby forming the plug 206.

Figure 2G:
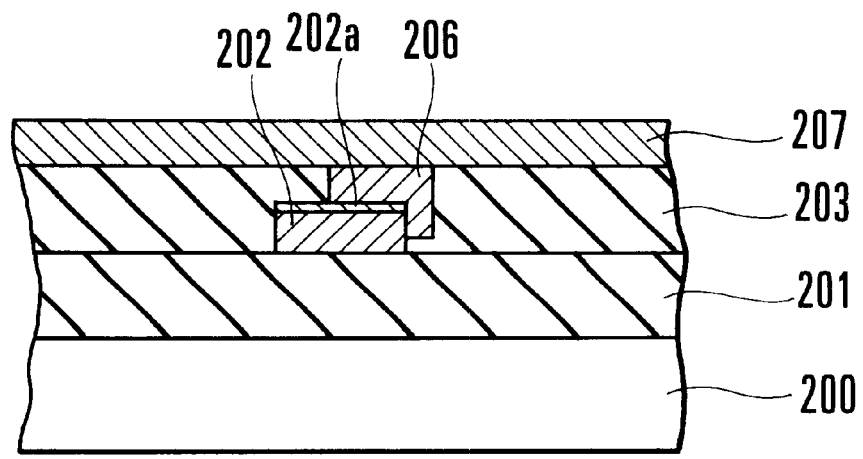
Figure 3A:
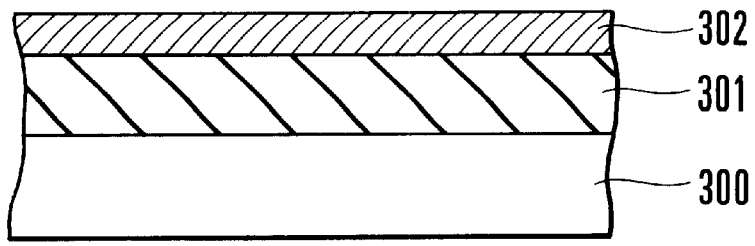
FIGS. 3A to 3F are views for explaining a conventional semiconductor device manufacturing method.
Figure 3B:
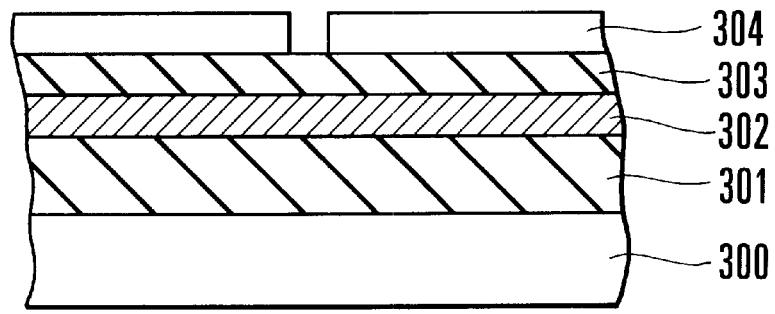
Figure 3C:
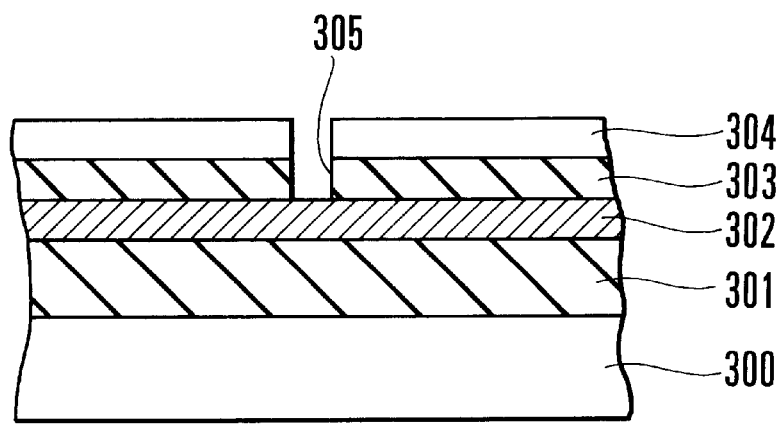
Figure 3D:
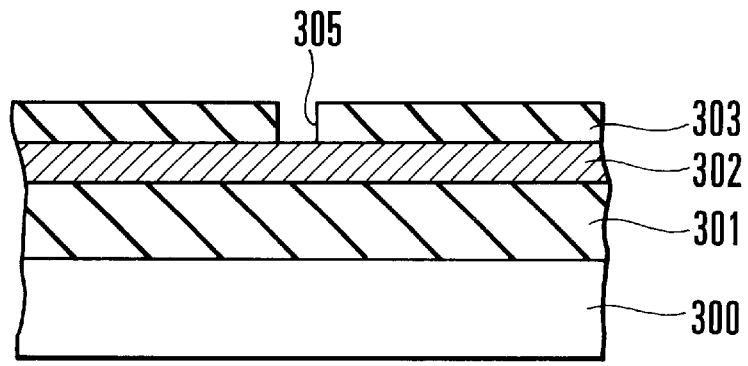
Figure 3E:
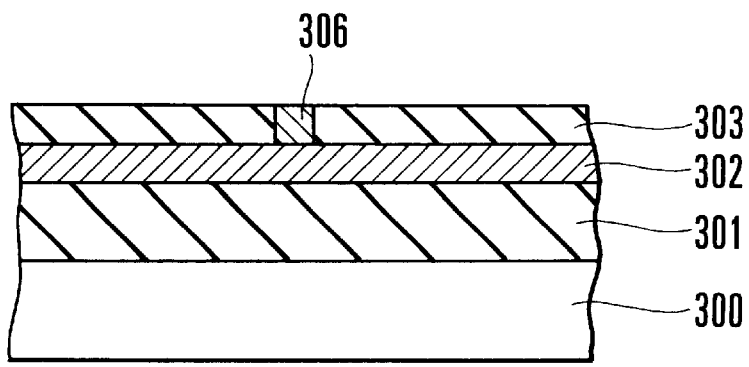
Figure 3F:
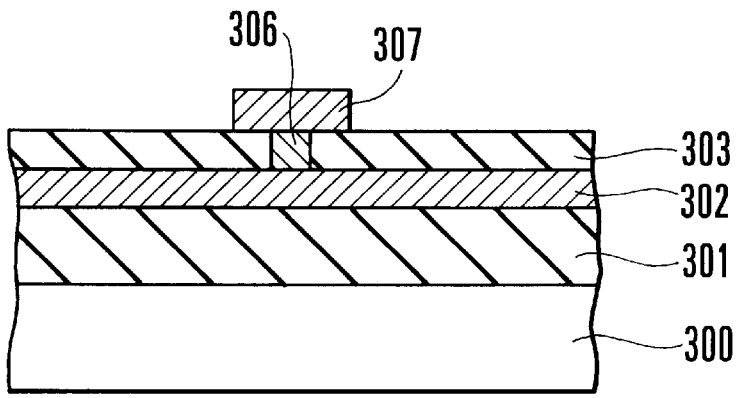

As shown in FIG. 2G, an upper interconnection 207 to be connected to the plug 206 is formed on the interlevel insulating film 103 including the plug 106. As a result, a multilevel interconnection structure free from a connection failure between the lower and upper interconnections 202 and 207 is formed.

As has been described above, according to the present invention, dry etching using the second plasma is performed without causing the deposit formed by dry etching using the first plasma to come into contact with the atmosphere. After that, the deposit is removed by etching using the second plasma, without coming into contact with the atmosphere. As a result, a connection failure between the plug and lower interconnection can be suppressed, and a connection failure between wiring layers can be suppressed.

What is claimed is:

1. A method of manufacturing a semiconductor device, comprising:

the first step of forming a lower interconnection on a semiconductor substrate having a first insulating film thereon;

the second step of forming a second insulating film on said semiconductor substrate including said lower interconnection;

the third step of forming a through hole in said second insulating film to reach said lower interconnection;

the fourth step of etching, after the third step is ended, a surface of said lower interconnection including a side surface thereof exposed to a bottom portion of the through hole, said fourth step taking place without exposing said semiconductor substrate to the atmosphere;

the fifth step of forming a plug made of a conductive material in the through hole; and the sixth step of forming an upper interconnection to be connected to said plug on said second insulating film;

wherein the third step comprises the step of forming the through hole by dry etching using a first plasma of a fluorine-containing gas in a vacuum vessel evacuated to a predetermined vacuum degree, and the fourth step comprises the step of removing the first plasma used in the third step in said vacuum vessel and thereafter generating a second plasma of an inert-gas to etch said surface of said lower interconnection exposed to said bottom portion of the through hole;

wherein the fourth step comprises the step of generating the second plasma with a lower power than that applied for generating the first plasma.

2. A method of manufacturing a semiconductor device, comprising:

the first step of forming a lower interconnection on a semiconductor substrate having a first insulating film thereon;

the second step of forming a second insulating film on said semiconductor substrate including said lower interconnection;

the third step of forming a through hole in said second insulating film to reach said lower interconnection;

the fourth step of etching, after the third step is ended, a surface of said lower interconnection including a side surface thereof exposed to a bottom portion of the through hole, said fourth step taking place without exposing said semiconductor substrate to the atmosphere;

the fifth step of forming a plug made of a conductive material in the through hole; and the sixth step of forming an upper interconnection to be connected to said plug on said second insulating film;

wherein the method further comprises a seventh step of forming, after the second step, a resist pattern having an opening portion on said second insulating film, an eighth step of ashing, after the fourth step, said resist pattern, and a ninth step of removing, after the eighth step, a residue of said resist pattern which is left by the ashing of the eighth step, and wherein the third step comprises the step of removing said second insulating film by using said resist pattern as a mask, thereby forming the through hole; and wherein the fourth step comprises the step of simultaneously removing a resist hardening layer formed on said resist pattern in the third step and an etching reaction deposit on said surface of said lower interconnection exposed to said bottom portion of the through hole.

3. A method of manufacturing a semiconductor device, comprising:

the first step of forming a lower interconnection on a semiconductor substrate through a first insulating film;

the second step of forming a second insulating film on said semiconductor substrate including said lower interconnection;

the third step of forming a resist pattern having an opening portion on said second insulating film;

the fourth step of selectively removing said second insulating film by dry etching using a fluorine-containing gas a first plasma while using said resist pattern as a mask, thereby forming a through hole in said second insulating film to reach said lower interconnection;

the fifth step of etching, after the fourth step is ended, a surface of said resist pattern and a surface of said lower interconnection exposed to a bottom portion of the through hole, by using an inert gas as a second plasma without exposing said semiconductor substrate to the atmosphere;

the sixth step of ashing said resist pattern by using oxygen gas as a third plasma;

the seventh step of removing a residue of said resist pattern, which is left by ashing of the sixth step, in accordance with a wet process using a solvent that dissolves said resist pattern;

the eighth step of forming a plug made of a conductive material in the through hole; and the ninth step of forming an upper interconnection to be connected to said plug on said second insulating film.

4. A method of manufacturing a semiconductor device, comprising:

the first step of forming a lower interconnection on a semiconductor substrate having a first insulating film thereon;

the second step of forming a second insulating film on said semiconductor substrate including said lower interconnection;

the third step of forming a through hole in said second insulating film to reach said lower interconnection by using a resist pattern as a mask;

the fourth step of etching, after the third step is ended, a surface of said lower interconnection including a side surface thereof exposed to a bottom portion of the through hole, said fourth step taking place without exposing said semiconductor substrate to the atmosphere;

the fifth step of forming a plug made of a conductive material in the through hole; and the sixth step of forming an upper interconnection to be connected to said plug on said second insulating film;

wherein the fourth step comprises the step of simultaneously removing a resist hardening layer formed on said resist pattern in the third step and an etching reaction deposit on said surface of said lower interconnection exposed to said bottom portion of the through hole.

* * * * *